(12) United States Patent
Wallace et al.

(10) Patent No.: US 12,106,943 B2
(45) Date of Patent: Oct. 1, 2024

(54) SUBSTRATE HALO ARRANGEMENT FOR IMPROVED PROCESS UNIFORMITY

(71) Applicant: Applied Materials, Inc., Santa Clara, CA (US)

(72) Inventors: Jay R. Wallace, Danvers, MA (US); Simon Ruffell, South Hamilton, MA (US); Kevin R. Anglin, Somerville, MA (US); Tyler Rockwell, Wakefield, MA (US); Christopher Campbell, Newburyport, MA (US); Kevin M. Daniels, Lynnfield, MA (US); Richard J. Hertel, Boxford, MA (US); Kevin T. Ryan, Wilmington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 565 days.

(21) Appl. No.: 17/329,883

(22) Filed: May 25, 2021

(65) Prior Publication Data

US 2022/0384156 A1    Dec. 1, 2022

(51) Int. Cl.
    *H01J 37/32*    (2006.01)
(52) U.S. Cl.
    CPC .. *H01J 37/32642* (2013.01); *H01J 37/32467* (2013.01); *H01J 37/32724* (2013.01)
(58) Field of Classification Search
    CPC ........... H01J 37/32467; H01J 37/32724; H01J 37/32642
    See application file for complete search history.

(56) References Cited

U.S. PATENT DOCUMENTS

| 2,831,520 | A |   | 4/1958  | Clarke |
| 4,944,860 | A |   | 7/1990  | Bramhall, Jr. et al. |
| 5,063,861 | A | * | 11/1991 | Imogawa .............. F16B 5/0266 |
|           |   |   |         | 285/911 |
| 5,556,500 | A |   | 9/1996  | Hasegawa et al. |
| 5,740,009 | A |   | 4/1998  | Pu et al. |
| 5,748,434 | A |   | 5/1998  | Rossman et al. |
| 6,344,105 | B1|   | 2/2002  | Daugherty et al. |

(Continued)

FOREIGN PATENT DOCUMENTS

| CN | 1790659 A | 6/2006 |
| CN | 101083223 A | 12/2007 |

(Continued)

OTHER PUBLICATIONS

International Search Report and Written Opinion dated Sep. 14, 2022, for the International Patent Application No. PCT/US2022/030354 filed on May 20, 2022, 9 pages.

(Continued)

*Primary Examiner* — Yuechuan Yu
(74) *Attorney, Agent, or Firm* — KDW Firm PLLC

(57) ABSTRACT

A substrate holder assembly including a substrate platen, the substrate platen disposed to support a substrate at a substrate position, a halo ring, the halo ring being disposed around the substrate position, and an outer halo being disposed around the halo ring and defining a first aperture, wherein the outer halo is disposed to engage the halo ring, the halo ring being disposed at least partially within the first aperture, the halo ring defining a second aperture, concentrically positioned within the first aperture, wherein the outer halo and the halo ring are formed at least partially of silicon, silicon carbide, doped silicon, quartz, and ceramic.

9 Claims, 5 Drawing Sheets

(56) References Cited

U.S. PATENT DOCUMENTS

| | | | |
|---|---|---|---|
| 6,423,642 | B1 | 7/2002 | Peace et al. |
| 6,949,165 | B2 | 9/2005 | Koshimizu |
| 8,702,903 | B2 | 4/2014 | Miyagawa et al. |
| 2002/0038691 | A1 | 4/2002 | Hayakawa |
| 2003/0106646 | A1 | 6/2003 | Ma et al. |
| 2004/0003780 | A1 | 1/2004 | Yudovsky et al. |
| 2004/0129226 | A1 | 7/2004 | Strang |
| 2006/0272774 | A1* | 12/2006 | Maehara ........... H01L 21/68757 118/728 |
| 2012/0055403 | A1 | 3/2012 | Gomi |
| 2012/0175063 | A1* | 7/2012 | Yamawaku ....... H01L 21/67069 156/345.46 |
| 2013/0186858 | A1 | 7/2013 | Suzuki |
| 2017/0069519 | A1 | 3/2017 | Shiraiwa |
| 2017/0092472 | A1 | 3/2017 | Koiwa et al. |
| 2019/0272983 | A1* | 9/2019 | Wallace ............ H01L 21/68735 |

FOREIGN PATENT DOCUMENTS

| | | |
|---|---|---|
| CN | 103765573 B | 11/2016 |
| JP | 2011-176228 A | 9/2011 |
| JP | 2016-065276 A | 4/2016 |
| JP | 2020053538 A | 4/2020 |
| KR | 100607094 B1 | 8/2006 |
| KR | 1020070036215 A | 4/2007 |
| KR | 10-1002748 B1 | 12/2010 |
| KR | 102111504 B1 | 5/2020 |
| TW | 201803127 A | 1/2018 |

OTHER PUBLICATIONS

International Search Report and Written Opinion mailed May 15, 2019 for PCT/US2019/015150 filed Jan. 25, 2019; 15 pages.

* cited by examiner

SUBSTRATE HALO ARRANGEMENT FOR IMPROVED PROCESS UNIFORMITY

FIELD

Embodiments of the present disclosure relate to semiconductor workpiece processing and, more particularly, to semiconductor workpiece processing using a substrate halo for process uniformity.

BACKGROUND

For plasma-aided and ion beam-aided device processing, a goal is often to generate process uniformity across a substrate. Substrates, such as semiconductor wafers, are often positioned to be surrounded by hardware, such as halos, to protect a process chamber, substrate, or other components not designed to receive a plasma or ion beam treatment. While a large portion of a substrate may receive relatively uniform treatment, a frequent observation is the presence of edge effects near the periphery of a substrate, where the edge effects may include non-uniform process results, as well as contamination, particle generation, and other unwanted results.

With respect to these and other considerations the present disclosure is provided.

BRIEF SUMMARY

In one embodiment, a substrate assembly may include an outer halo, the outer halo comprising a first material, and defining a first aperture. The substrate holder may include a halo ring, where the halo ring includes a second material and is disposed at least partially within the first aperture. The halo ring may define a second aperture, concentrically positioned within the first aperture, wherein the halo ring is coupled to accommodate a substrate therein.

A substrate assembly in accordance with an exemplary embodiment of the present disclosure may include an outer halo defining a first aperture and a halo ring disposed at least partially within the first aperture, the halo ring defining a second aperture, concentrically positioned within the first aperture, wherein the halo ring is coupled to accommodate a substrate therein, wherein the outer halo and the halo ring are formed at least partially of one of silicon, silicon carbide, doped silicon, quartz, and ceramic.

A substrate holder assembly in accordance with an exemplary embodiment of the present disclosure may include a substrate platen, the substrate platen disposed to support a substrate at a substrate position, a halo ring, the halo ring being disposed around the substrate position, and an outer halo being disposed around the halo ring and defining a first aperture, wherein the outer halo is disposed to engage the halo ring, the halo ring being disposed at least partially within the first aperture, the halo ring defining a second aperture, concentrically positioned within the first aperture, wherein the outer halo and the halo ring are formed at least partially of silicon, silicon carbide, doped silicon, quartz, and ceramic.

A processing apparatus in accordance with an exemplary embodiment of the present disclosure may include a process chamber, and a substrate holder assembly, disposed in the process chamber, the substrate holder assembly including a substrate platen, the substrate platen disposed to support a substrate at a substrate position, a halo ring, the halo ring being disposed around the substrate position, and an outer halo disposed around the halo ring and configured to engage the halo ring, wherein the outer halo and the halo ring are formed at least partially of silicon, silicon carbide, doped silicon, quartz, and ceramic.

BRIEF DESCRIPTION OF THE DRAWINGS

The accompanying drawings illustrate example approaches of the disclosure, including the practical application of the principles thereof, as follows.

Figure 1A:
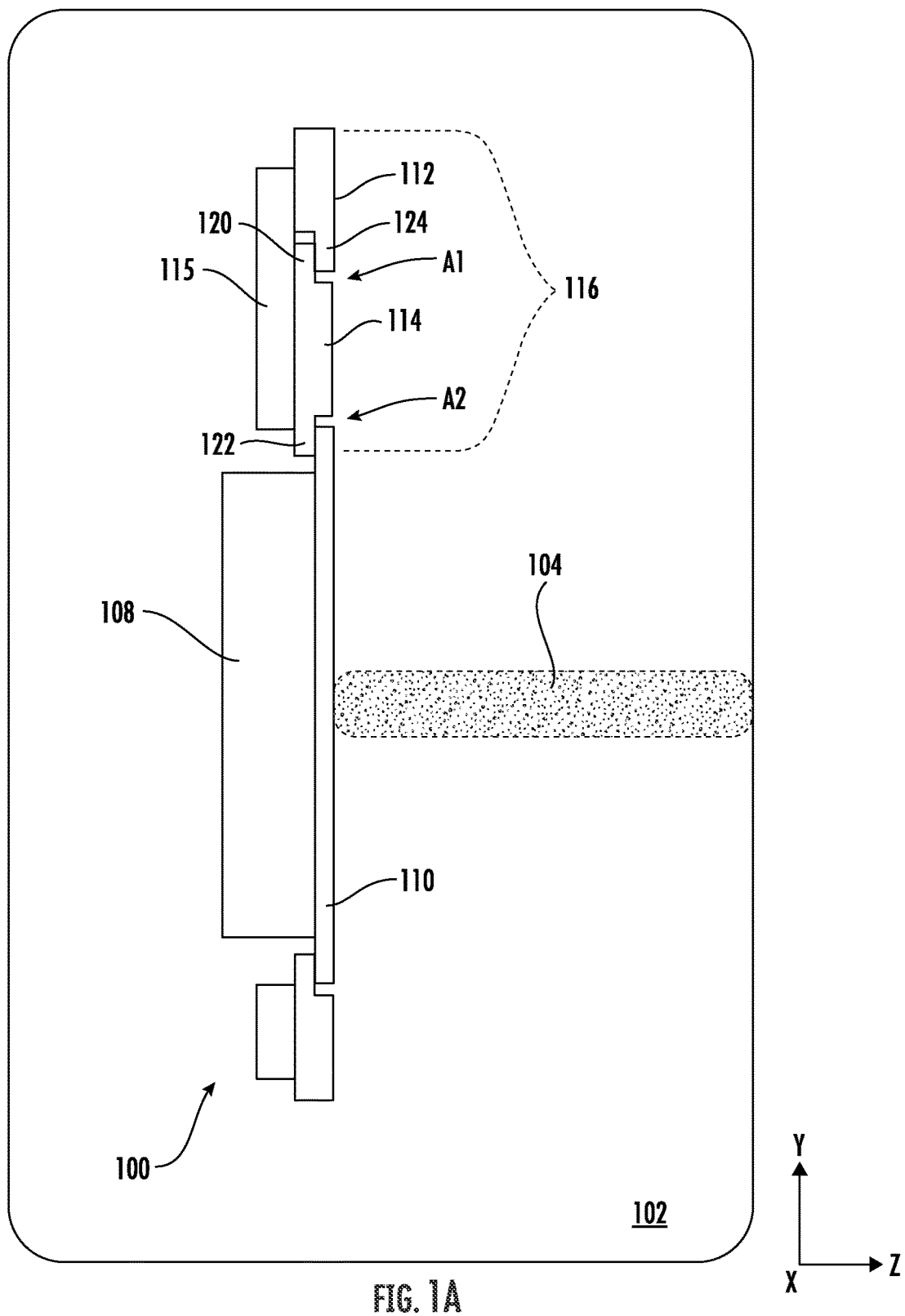
FIG. 1A is a schematic view illustrating a side view of a processing apparatus in accordance with embodiments of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Referring now to FIG. 1A, a processing apparatus 100 is shown, where the processing apparatus 100 may be used for processing substrates such as semiconductor wafers. The processing apparatus 100 includes a process chamber 102. The process chamber 102 includes a substrate holder assembly 106, where the structure and function of the substrate holder assembly 106 is detailed below. In brief, the substrate holder assembly 106 may include a substrate platen 108, disposed to hold a substrate 110, an outer halo 112, and a halo ring 114. The outer halo 112 and halo ring 114 may be removable fastened to a halo base 115 (as further described below) and may function as a substrate assembly 116, to adjust and improve processing of substrates. As shown in FIG. 1A, the process chamber 102 may include processing species 104, used to process a substrate 110, disposed in the substrate assembly 116.

As further shown in FIG. 1A, the outer halo 112 defines a first aperture, whose edges are shown by A1, while the halo ring 114 defines a second aperture, whose edges are shown by A2, where the second aperture is concentrically positioned within the first aperture. As shown, the halo ring 114 may be coupled to accommodate a substrate 110 within the second aperture.

The processing apparatus 100 according to different embodiments may be an etching tool, to perform etching operations on the substrate 110, a deposition tool, or a combination of etching and deposition tool. In some embodiments, the processing apparatus 100 may be an implanting tool to introduce implanted species into the substrate 110. As such, the processing apparatus 100 may be a plasma-based tool, including a plasma etching tool such as a reactive ion etching tool, a plasma doping (PLAD) apparatus, a plasma assisted chemical vapor deposition (PECVD) tool, an ion beam tool, a reactive ion beam etching tool, or other tool.

As shown schematically in FIG. 1A, the processing apparatus 100 may generate and contain processing species 104, where the processing species 104 may represent the appropriate species to perform substrate processing of substrate 110. Thus, the processing species may include ions, reactive ions, reactive neutrals, implanting species, and so forth. While the processing species 104 are shown as contained within the process chamber 102, in various embodiments, the processing apparatus 100 may include a plurality of chambers, including ion sources, plasma sources, separate from the process chamber 102. In other embodiments, the process chamber 102 may be a plasma chamber. The embodiments are not limited in this context.

Figure 1B:
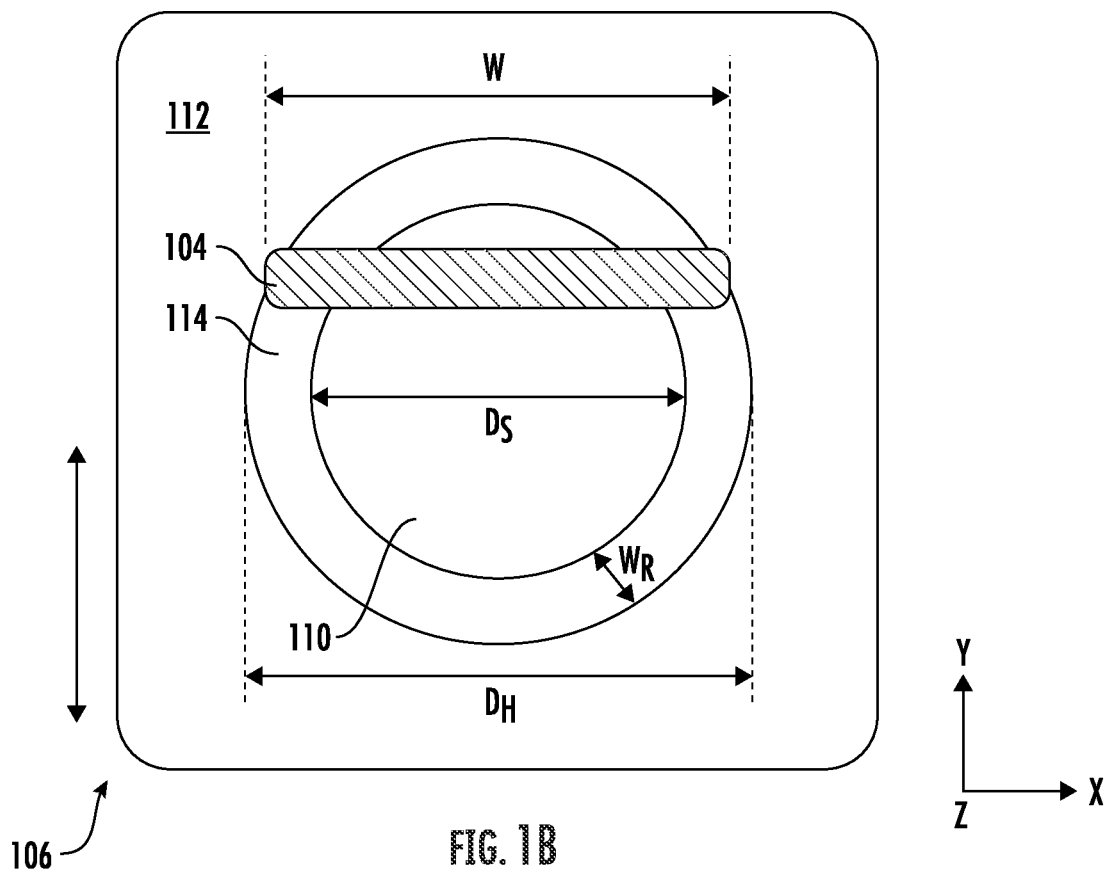
FIG. 1B is a schematic view illustrating face on view of a substrate holder assembly in accordance with embodiments of the present disclosure.
Figure 1C:
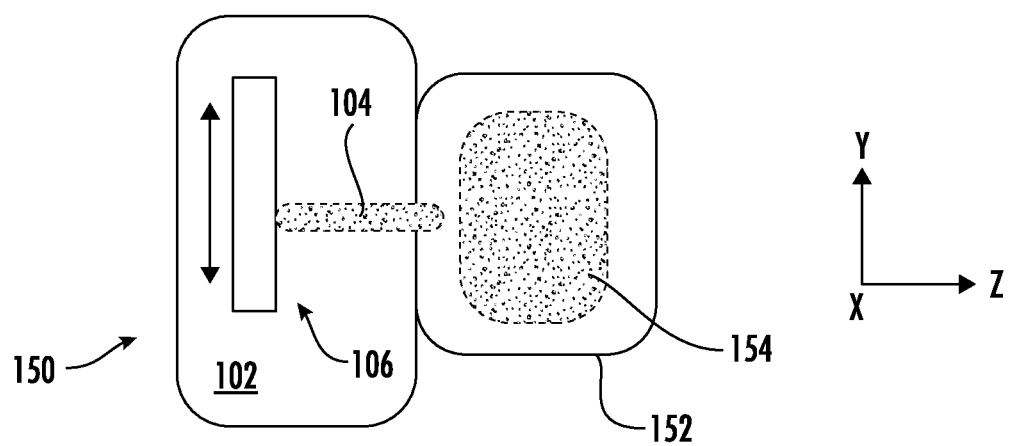
FIG. 1C is a schematic view illustrating a side view of another processing apparatus in accordance with embodiments of the present disclosure.

Turning now to FIG. 1B there is shown a face-on view, illustrating one embodiment of the substrate assembly 116. In this example, the processing species 104 are configured as an elongated ion beam or ribbon beam, shown in cross-section within the X-Y plane of the illustrated Cartesian coordinate system. The ribbon beam may be provided from a plasma chamber through an extraction plate as in known apparatus. Referring now to FIG. 1C, a processing apparatus 150 is shown, where the processing apparatus 150 includes a plasma chamber 152, adjacent the above-described process chamber 102. The processing species 104 are extracted as a ribbon beam from a plasma 154 in the plasma chamber 152 as in known apparatus.

As indicated in FIGS. 1B and 1C, the substrate holder assembly 106 may be scanned in some embodiments, along a direction parallel to the Y-axis of the illustrated Cartesian coordinate system, as shown by the arrows. In some embodiments the ribbon beam containing the processing species 104 may be characterized by a width W, where the width W exceeds the substrate diameter Ds. In this manner, the entirety of the substrate 110 may be treated with the processing species 104.

According to various embodiments, the outer halo 112 may be formed of a first material, such as any suitable material (e.g., silicon, silicon carbide, doped silicon, quartz, ceramic, etc.). The outer halo 112 may be formed of a plurality of tiles (as further described below), for example. In various embodiments, the halo ring 114 may be formed of a second material, where the second material may be the same as the first material (e.g., silicon, silicon carbide, doped silicon, quartz, ceramic, etc.) or may differ from the first material.

In various embodiments, the halo ring 114 may be coupled to the outer halo 112 in a reversibly detachable manner, as detailed below. The halo ring 114 may accordingly represent any number of different halo rings, where the material of the halo ring 114 may be selected according to a particular application. Thus, one halo ring 114 may be substituted for another halo ring, allowing for replacement due to wear or damage. Additionally, a first halo ring made of a first halo ring material may be substituted for a second halo ring made of a different, second halo ring material, when appropriate. For example, when the material of substrate 110 is changed or when the processing conditions of the processing apparatus 100 are sufficiently altered, a swap of halo ring 114 for another halo ring may be appropriate.

One function of the substrate assembly 116 according to various embodiments of the disclosure is to effectively extend the diameter of the substrate 110, in the sense where the halo ring 114 may mimic certain properties of the substrate 110. As an example, when the substrate 110 is a silicon wafer or silicon alloy wafer, the halo ring 114 may be composed of a similar material, such as silicon, silicon carbide, doped silicon, quartz, or ceramic (e.g., yttria/zirconia blend). In this manner, edge effects otherwise generated near the edges of the substrate 110 by the process species 104 may be reduced or eliminated, because the substrate 110 and halo ring 114 "appear" to the processing species 104 as a substrate having the diameter $D_H$. Thus, because the width W may exceed the diameter of the substrate Ds, any edge effects may occur at the outer edges of the ribbon beam defined by the processing species 104 or the outer edge of the halo ring 114.

By way of reference, in known halo arrangements, the halo may be a monolithic piece, formed of a metal, such as titanium to provide mechanical and thermal robustness under treatment by an ion beam or plasma. As such, edge effects near the region where the substrate meets the halo may be generated, at least in part due to the differences in material between substrate and halo.

In accordance with some non-limiting embodiments, the diameter $D_H$ may exceed the width W, wherein during scanning, the outer edges of the ribbon beam defined by the process species 104 are scanned over material of the halo ring 114, at the widest part. According to various embodiments, the diameter $D_H$ may exceed 300 mm, and in some cases, may be in the range of 450 mm. A width $W_R$ of the halo ring 114 may in the order of 15 mm to 75 mm. The embodiments are not limited in this context.

Referring again to FIG. 1A, the halo ring 114 may have an annular first notch or shoulder 120 (hereinafter "the first shoulder 120") formed in a radially outermost edge of a front surface thereof, and an annular second notch or shoulder 122 (hereinafter "the second shoulder 122") formed in a radially innermost edge of the front surface thereof. The outer halo 112 may have an annular notch or shoulder 124 (hereinafter "the shoulder 124") formed in a radially innermost edge of a rear surface thereof, wherein the shoulder 124 of the outer halo 112 is disposed in confronting, mating abutment with the first shoulder 120 of the halo ring 114, with the front surface of the halo ring 114 coplanar with a front surface of the outer halo 112. The second shoulder 122 of the halo ring 114 may have a depth equal to a thickness of the substrate 110 and may define a counterbore for receiving the substrate 110, with the front surface of the substrate 110 coplanar with the front surface of the halo ring 114 as depicted.

In various embodiments, a substrate assembly in accordance with the present disclosure may further include a fastener assembly, where the fastener assembly is adapted to reversibly attach the outer halo 112 and the halo ring 114 to the halo base 115 (see FIG. 1A). For example, referring to FIG. 2A, a substrate assembly 200 in accordance with the present disclosure may include an upper halo 112A and a lower halo 112B, where a halo ring 114 is arranged concentrically within the upper halo 112A. As shown, the upper halo 112A is formed of a plurality of tiles and the lower halo 112B is formed of a plurality of tiles. In various alternative embodiments, the upper halo 112A may be formed of a single tile and/or the lower halo 112B may be formed of a single tile. The present disclosure is not limited in this regard. The substrate assembly 200 further includes a fastener assembly, arranged as a plurality of fasteners 206, coupling the halo ring 114, the upper halo 112A, and the lower halo 112B to the halo base 115.

Figure 2A:
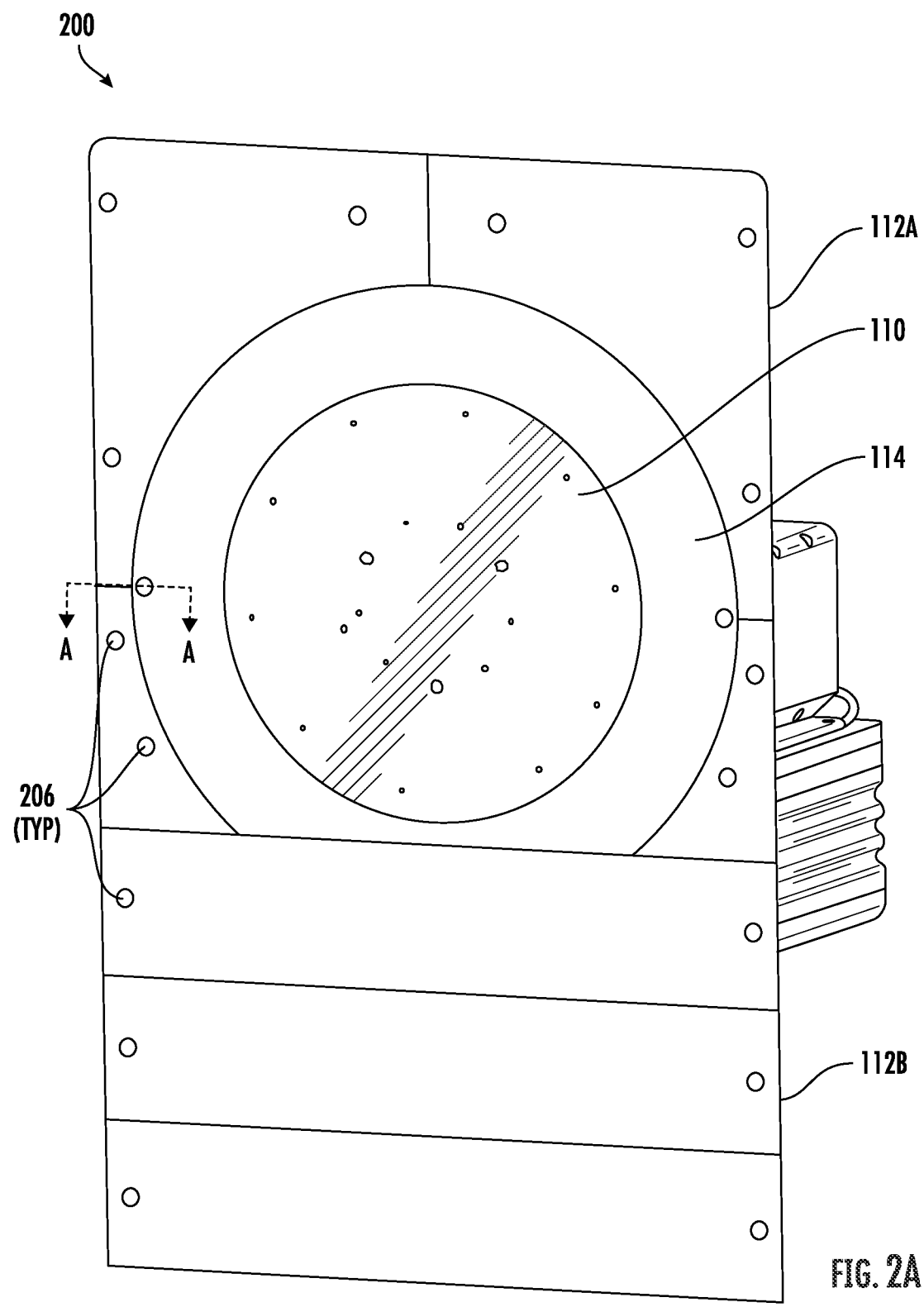
FIG. 2A is a front perspective view of another substrate holder assembly in accordance with embodiments of the present disclosure.
Figure 2B:
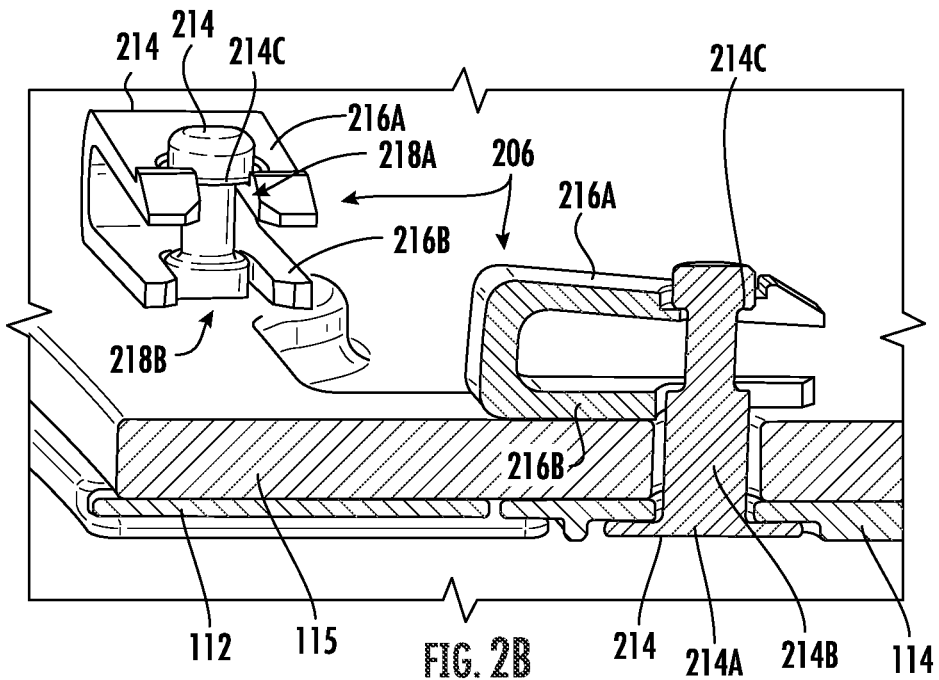
FIG. 2B is a sectional view along the cut A-A of FIG. 2A.

Referring to FIG. 2B, there is shown a cross-sectional view through section A-A of FIG. 2A, extending through one of the fasteners 206. As shown therein, the fasteners 206 may include studs 214, where the studs 214 may be formed of a ceramic or a coated material. The studs 214 may include head portions 214A disposed in flat engagement with front surfaces of the outer halo 112 and the halo ring 114 (and optionally disposed within counterbores formed therein, as shown), and shank portions 214B extending from the head portions 214A through the outer halo 112 or the halo ring 114 and through the halo base 115. The shank portions 214B may define respective shoulders 214C facing, and spaced apart from, the backside of the halo base 115. The fasteners 206 may further include generally U-shaped retaining clips 216 formed of resilient material (e.g., spring steel, plastic, composite, etc.). The retaining clips 216 may include first and second fingers 216A, 216B having respective notches 218A, 218B formed therein. When the retaining clips 216 are operatively installed as shown in FIG. 2B, the shank portions 214B of the studs 214 may be disposed within the notches 218A, 218B, and the first and second fingers 216A, 216B may be held in compression (i.e., compressed toward one another) between the shoulders 214C of the shank portions 214B and rear surface of the halo base 115. Thus, the retaining clips 216 may exert a rearwardly-directed force on the shank portions 214B of the studs 214, pulling the head portions 214A of the studs 214 toward the front surface of the halo base 115 to hold the outer halo 112 and the halo ring 114 in secure engagement therewith.

In exemplary embodiments, the maximum holding force generated by the fastener 206 may be 1 lb. to 1.5 lbs. This limitation of clamping force aids in ensuring the outer halo 112 and halo ring 114 do not break under the stress of the holding force, especially in embodiments where outer halo 112 and halo ring 114 are made of a brittle material, such as silicon.

Figure 2C:
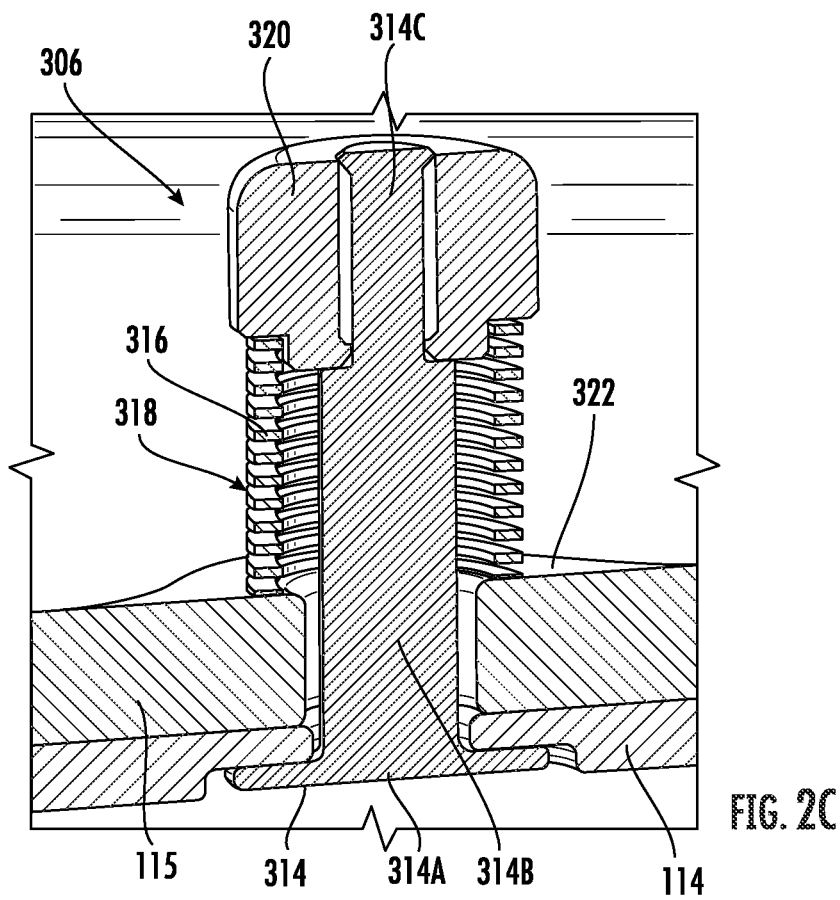
FIG. 2C is a sectional view of a fastener in accordance with the present disclosure.

Referring to FIG. 2C, a cross-sectional view illustrating an alternative fastener 306 is shown. In various embodiments of the above-described fastener assembly, the fastener 306 may be substituted for one or more of the fasteners 206. The fastener 306 may include a stud 314 formed of a ceramic or a coated material. The stud 314 may include a head portion 314A disposed in flat engagement with front surfaces of the outer halo 112 and the halo ring 114 (and optionally disposed within counterbores formed therein, as shown), and a shank portion 314B extending from the head portion 314A through the outer halo 112 or the halo ring 114 and through the halo base 115. The shank portion 314B may have a threaded end 314C disposed proximate the backside of the halo base 115. The fastener 306 may further include a coil spring 316 disposed in a counterbore 318 in the backside of the halo base 115 and surrounding the shank portion 314B of the stud 314. The fastener 306 may further include a nut 320 threadedly engaging the threaded end 314C of the stud 314 and compressing the coil spring 316 between the nut 320 and a rear surface 322 of the halo base 115 within the counterbore 318. Thus, as the nut is tightened on the threaded end 314C, a rearwardly-directed force exerted by the coil spring 316 on the nut 320 increases, pulling the head portion 314A of the stud 314 toward the front surface of the halo base 115 to hold the outer halo 112 (or the halo ring 11) in secure engagement therewith.

In exemplary embodiments, the maximum holding force generated by the fastener 306 may be 1 lb. to 1.5 lbs. This limitation of clamping force aids in ensuring the outer halo 112 and halo ring 114 do not break under the stress of the holding force, especially in embodiments where outer halo 112 and halo ring 114 are made of a brittle material, such as silicon.

Figure 3:
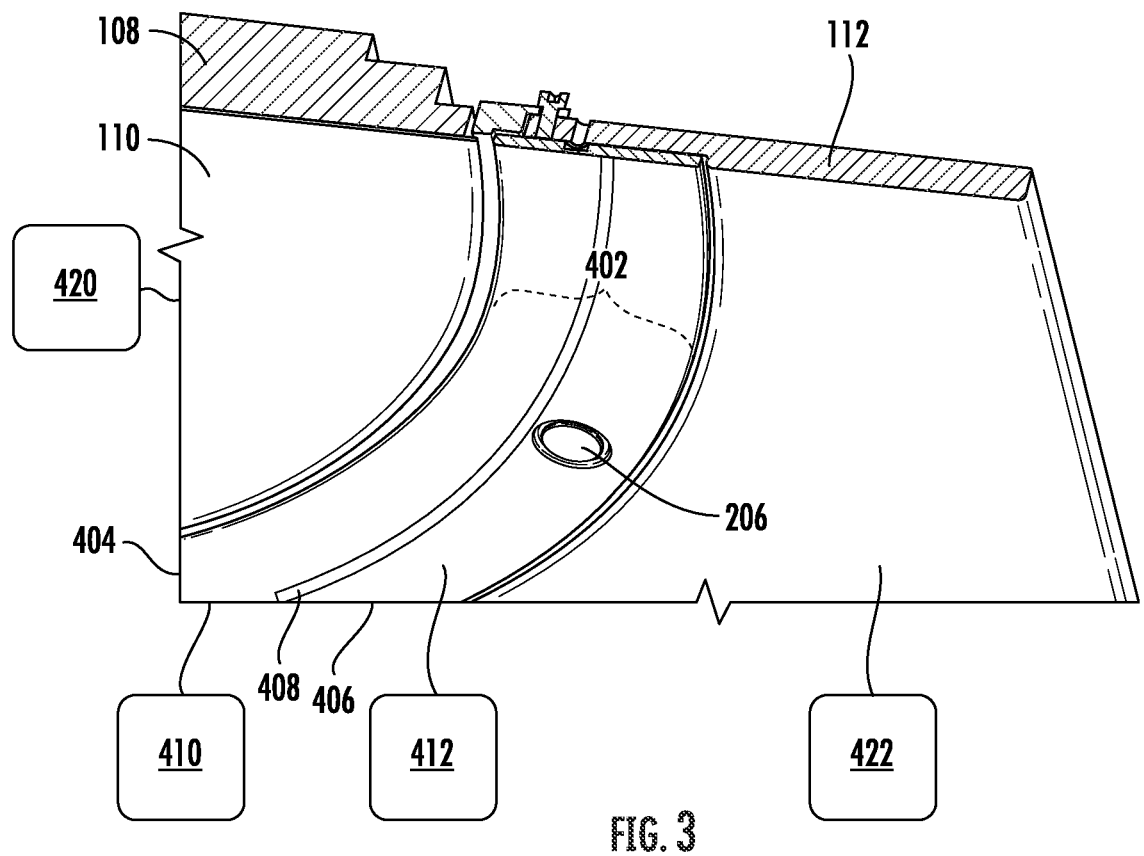
FIG. 3 is a perspective, cutaway view of an additional substrate holder assembly in accordance with embodiments of the present disclosure.

Turning to FIG. 3 there is shown an embodiment of a substrate assembly 400 in accordance with the present disclosure, where a halo ring 402 comprises an outer ring 406 and an inner ring 404, disposed within the outer ring 406. The inner ring 404 may define the second aperture as described above. The outer ring 406 and inner ring 404 may be separated from one another or electrically isolated from one another by a gap or spacer, shown as a spacer 408. In some embodiments, the outer ring 406 comprises a first ring material, and the inner ring 404 comprises a second ring material, different from the first ring material. According to some embodiments, the inner ring 404 may be electrically biased, or the outer ring 406 may be electrically biased, while in some embodiments the inner ring 404 and outer ring 406 may be individually coupled to receive different electrical biases, as shown by the voltage source 410 and voltage source 412, respectively. In some embodiments, the substrate platen 108 may also be coupled to a voltage source 420, while the outer halo 112 is separately coupled to a voltage source 422. Accordingly, during operation, voltages applied to the inner ring 404 and outer ring 406 may be the same or may differ from one another. Additionally, the inner ring 404 and/or the outer ring 406 may be biased at a same voltage as a voltage applied to the substrate platen 108, or a different voltage from the voltage applied to substrate platen 108. Similarly, the outer halo 112 may be coupled to receive the same or different voltage from the voltage applied to any of the inner ring 404, outer ring 406, and substrate platen 108.

In one embodiment, the inner ring 404, outer ring 406, or the two, may be configured to receive heating, separately from any heating provided to the substrate 110, as shown by the heater 416 and heater 418, respectively. According to different embodiments, the outer ring 406 and inner ring 404 may be coupled to receive different temperatures from one another. The substrate platen 108 or substrate 110 may be coupled to a heater 424 to be separately heated from inner ring 404 and outer ring 406, while the outer halo 112 is independently coupled to a heater 426. Thus, these components may be heated to a same or different temperature as the temperature for other components of substrate assembly 400.

A halo ring, such as halo ring 402, may be arranged flexibly, so as to define multiple planes, such as a first plane for the inner ring 404 and a second plane for outer ring 406. As such, by providing biasing or heating to a halo ring or inner and outer halo rings, independently of a substrate platen, or independently of an outer halo, the local environment near the periphery of a substrate may be carefully adjusted or controlled to account for edge effects and to improve process uniformity.

In particular embodiments where a silicon halo was employed in an ion beam etch system in conjunction with etching of silicon wafers, etch rate variation across the wafer was improved from 5% non-uniformity when no halo ring was used, to 1% uniformity with the use of a halo ring.

In summation, embodiments described herein provide at least the following technical advantages. For a first advantage, the present embodiments provide flexibility in reducing edge effects by providing detachable halo rings, where the material of the halo ring may be changed to accommodate substrate changes or process changes. For a second advantage, the use of a narrow insert as a halo ring allows materials to be easily replaced to accommodate for wear.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A substrate assembly, comprising:
    an outer halo defining a first aperture;
    a halo ring disposed at least partially within the first aperture, the halo ring defining a second aperture, concentrically positioned within the first aperture, wherein the halo ring is coupled to accommodate a substrate therein; and
    a fastener assembly disposed to reversibly attach the outer halo and the halo ring to a halo base, the fastener assembly comprising a fastener including a stud having a shank portion defining a shoulder, a U-shaped retaining clip formed of a resilient material and having first and second fingers with respective notches forming forked edges, the shank portion of the stud extending through the notches, the retaining clip being held in compression between the shoulder and a rear surface of the halo base;
    wherein the outer halo and the halo ring are formed at least partially of one of silicon, silicon carbide, doped silicon, quartz, and ceramic.

2. The substrate assembly of claim 1, wherein the outer halo and the halo ring are formed entirely of silicon.

3. The substrate assembly of claim 1, wherein the halo ring comprises an outer ring and an inner ring, disposed within the outer ring, the inner ring defining the second aperture, wherein the outer ring comprises a first ring material, and the inner ring comprises a second ring material, different from the first ring material.

4. The substrate assembly of claim 1, wherein the halo ring has an annular first shoulder formed in a radially outermost edge of a front surface thereof and an annular second shoulder formed in a radially innermost edge of the front surface thereof, and the outer halo has an annular shoulder formed in a radially innermost edge of a rear surface thereof, wherein the shoulder of the outer halo is disposed in confronting, mating abutment with the first shoulder.

5. The substrate assembly of claim 4, wherein the front surface of the halo ring is coplanar with a front surface of the outer halo.

6. A substrate holder assembly, comprising:
    a substrate platen, the substrate platen disposed to support a substrate at a substrate position;
    a halo ring, the halo ring being disposed around the substrate position; and
    an outer halo being disposed around the halo ring and defining a first aperture, wherein the outer halo is disposed to engage the halo ring, the halo ring being disposed at least partially within the first aperture, the halo ring defining a second aperture, concentrically positioned within the first aperture; and
    a fastener assembly disposed to reversibly attach the outer halo and the halo ring to a halo base, the fastener assembly comprising a fastener including a stud having a shank portion defining a shoulder, a U-shaped retaining clip formed of a resilient material and having first and second fingers with respective notches forming forked edges, the shank portion of the stud extending through the notches, the retaining clip being held in compression between the shoulder and a rear surface of the halo base;
    wherein the outer halo and the halo ring are formed at least partially of one of silicon, silicon carbide, doped silicon, quartz, and ceramic.

7. The substrate holder assembly of claim 6, wherein the outer halo and the halo ring are formed entirely of silicon.

8. The substrate holder assembly of claim 6, wherein the halo ring comprises an outer ring and an inner ring, disposed within the outer ring, the inner ring defining the second aperture, wherein the outer ring comprises a first ring material, and the inner ring comprises a second ring material, different from the first ring material.

9. The substrate holder assembly of claim 6, wherein the halo ring has an annular first shoulder formed in a radially outermost edge of a front surface thereof and an annular second shoulder formed in a radially innermost edge of a front surface thereof, and the outer halo has an annular shoulder formed in a radially innermost edge of a rear surface thereof, wherein the shoulder of the outer halo is disposed in confronting, mating abutment with the first shoulder.

* * * * *